(12) United States Patent
Choi et al.

(10) Patent No.: US 8,344,384 B2
(45) Date of Patent: Jan. 1, 2013

(54) THIN FILM TRANSISTOR AND MANUFACTURING METHOD THEREOF

(75) Inventors: Sung Hwan Choi, Seoul (KR); Min Koo Han, Seoul (KR)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 13/024,978

(22) Filed: Feb. 10, 2011

(65) Prior Publication Data

US 2012/0187407 A1  Jul. 26, 2012

(30) Foreign Application Priority Data

Jan. 21, 2011  (KR) .................. 10-2011-0006270

(51) Int. Cl.
*H01L 29/04* (2006.01)

(52) U.S. Cl. .......................................... 257/60; 257/59

(58) Field of Classification Search ............. 257/60, 257/59

See application file for complete search history.

(56) References Cited

U.S. PATENT DOCUMENTS

| 2010/0117073 A1 | 5/2010 | Yamazaki et al. | |
| 2010/0148168 A1* | 6/2010 | Lai et al. | 257/43 |
| 2010/0176393 A1* | 7/2010 | Kim et al. | 257/43 |
| 2011/0140095 A1* | 6/2011 | Kim et al. | 257/43 |

FOREIGN PATENT DOCUMENTS

KR  10-2010-0051544  5/2010

* cited by examiner

*Primary Examiner* — Douglas Menz
(74) *Attorney, Agent, or Firm* — Yoo & Associates (57) ABSTRACT

Disclosed are a thin film transistor and a method of manufacturing the thin film transistor. An electrode layer of the thin film transistor includes a seed layer formed of a transparent conductive material doped with indium gallium zinc oxide (IGZO) and a main layer formed of a transparent conductive material. The thin film transistor includes a substrate, a gate electrode on the substrate, a gate insulation film on the substrate to cover the gate electrode, a semiconductor layer disposed on the gate insulation film in a region corresponding to the gate electrode, an electrode layer having a double layer structure and disposed on the gate insulation film in a manner such that a topside portion of the semiconductor layer is exposed through the electrode layer, and a passivation layer on the gate insulation film to cover the semiconductor layer and the electrode layer.

13 Claims, 10 Drawing Sheets

THIN FILM TRANSISTOR AND MANUFACTURING METHOD THEREOF

CROSS-REFERENCE TO RELATED APPLICATION

This application claims priority to and the benefit of Korean Patent Application No. 10-2011-0006270 filed on Jan. 21, 2011, which is herein incorporated by reference in its entirety.

BACKGROUND OF THE INVENTION

1. Field of the Invention

The present invention relates generally to a thin film transistor and a method of manufacturing the thin film transistor.

2. Description of the Related Art

Thin film transistors (TFTs) are used as active devices for displays such as liquid crystal displays. Generally, a thin film transistor includes a semiconductor layer, a gate electrode, a source electrode, and a drain electrode. The source and drain electrodes are important for the electric characteristics of a display. Therefore, various researches have been conducted to develop materials of source and drain electrodes that can improve the electric characteristics of a display.

SUMMARY OF THE INVENTION

An aspect of the present invention provides a thin film transistor including an electrode layer having a seed layer and a main layer, and a method of manufacturing the transistor. The seed layer is formed of a transparent conductive material doped with indium gallium zinc oxide (IGZO), and the main layer formed of a transparent conductive material, so as to reduce the contact resistance between the electrode layer and a semiconductor layer for improving the electric characteristics of the thin film transistor.

According to at least one of embodiments, a thin film transistor including: a substrate; a gate electrode disposed on the substrate; a gate insulation film disposed on the substrate to cover the gate electrode; a semiconductor layer disposed on the gate insulation film in a region corresponding to the gate electrode; an electrode layer having a double layer structure and disposed on the gate insulation film in a manner such that a topside portion of the semiconductor layer is exposed through the electrode layer; and a passivation layer disposed on the gate insulation film to cover the semiconductor layer and the electrode layer.

The electrode layer may include: a seed layer making contact with a top surface of the gate insulation film and a lateral surface of the semiconductor layer; and a main layer making contact with a top surface of the seed layer.

The main layer may be thicker than the seed layer.

A thickness of the seed layer may be about ¼ of a total thickness of the electrode layer.

The seed layer may be formed by doping a transparent conductive material with indium gallium zinc oxide (IGZO).

The main layer may be formed of a transparent conductive material.

The transparent conductive material may be one selected from indium tin oxide (ITO), indium zinc oxide (IZO), zinc oxide (ZnO), tin oxide ($SnO_2$), and indium oxide ($In_2O_3$).

The electrode layer may be divided into: a source electrode disposed at a side of the semiconductor layer; and a drain electrode disposed at the other side of the semiconductor layer and spaced apart from the source electrode.

According to another embodiment, there is provided a method of manufacturing a thin film transistor, the method including: preparing a substrate; forming a gate electrode on the substrate; forming a gate insulation film on the substrate to cover the gate electrode; forming a semiconductor layer on the gate insulation film in a region corresponding to the gate electrode; forming an electrode layer having a double layer structure on the gate insulation film in a manner such that a topside portion of the semiconductor layer is exposed through the electrode layer; and forming a passivation layer on the gate insulation film to cover the semiconductor layer and the electrode layer.

The forming of the electrode layer may include: forming a seed layer that makes contact with a top surface of the gate insulation film and a lateral surface of the semiconductor layer; and forming a main layer that makes contact with a top surface of the seed layer.

The forming of the electrode layer may be performed thickness a deposition process at normal temperature and a thermal annealing process at about 350° C.

The forming of the electrode layer may be performed such that the main layer is thicker than the seed layer.

The seed layer may be formed of a transparent conductive material doped with IGZO.

The main layer may be formed of a transparent conductive material.

The transparent conductive material may be one selected from indium tin oxide (ITO), indium zinc oxide (IZO), zinc oxide (ZnO), tin oxide ($SnO_2$), and indium oxide ($In_2O_3$).

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, embodiments will be described in detail with reference to the accompanying drawings.

Figure 1:
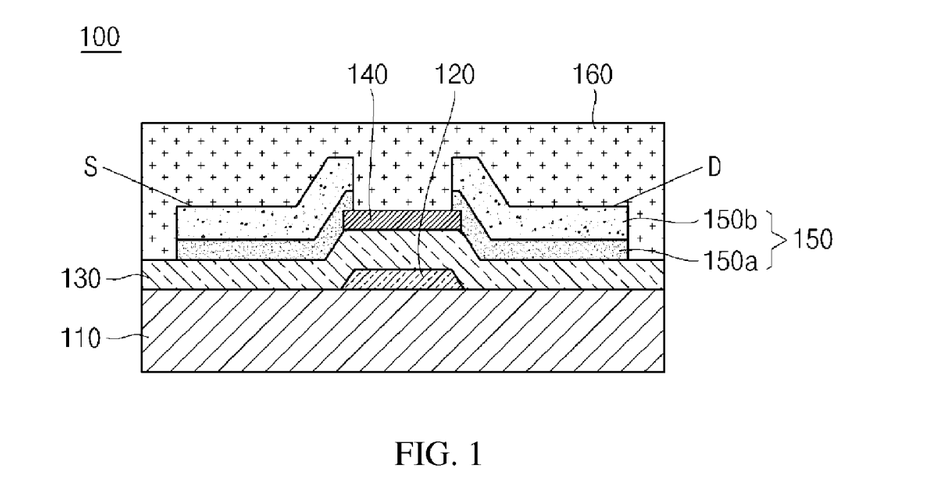
FIG. 1 is a cross sectional view illustrating a thin film transistor according to an embodiment.

Referring to FIG. 1, a thin film transistor 100 of the current embodiment includes a substrate 110, a gate electrode 120, a gate insulation film 130, a semiconductor layer 140, an electrode layer 150, and a passivation layer 160.

The substrate 110 may be one of a ceramic substrate, a silicon wafer substrate, a glass substrate, a polymer substrate, and an equivalent thereof. The glass substrate may be formed of a silicon oxide. The polymer substrate may be formed of a polymer material such as polyethylene terephthalate (PET), polyethylene naphthalate (PEN), and a polyimide. It should be noted that the listing of the above materials should not be seen as to limit the scope of the present invention. Other materials may be used without departing from the spirit and scope of the present invention.

The gate electrode 120 may be formed on the substrate 110 as a pattern having a predetermined width and length. The gate electrode 120 may be formed of an electrode material. For example, the gate electrode 120 may be formed of an opaque reflection metal selected from aluminum (Al), tin (Sn), tungsten (W), gold (Au), chromium (Cr), molybdenum (Mo), palladium (Pd), platinum (Pt), nickel (Ni), titanium (Ti), and an equivalent thereof. In another example, the gate electrode 120 may be formed of a transparent conductive oxide selected from indium tin oxide (ITO), indium zinc oxide (IZO), zinc oxide (ZnO), tin oxide ($SnO_2$), indium oxide ($In_2O_3$), and an equivalent thereof. However, the present invention is not limited to such materials.

The gate insulation film 130 is formed on the substrate 110 to cover the gate electrode 120. The gate insulation film 130 may be formed of a gate insulation material. For example, the gate insulation film 130 may be one of an oxide film, a nitride film, and en equivalent thereof. However, the present invention is not limited to such materials.

The semiconductor layer 140 is formed on the gate insulation film 130 in a region corresponding to the gate electrode 120. The semiconductor layer 140 may be an oxide semiconductor layer. In detail, the semiconductor layer 140 may be formed of amorphous indium gallium zinc oxide (IGZO) by injecting indium (In) and gallium (Ga) in zinc oxide (ZnO). A semiconductor layer formed of amorphous IGZO is uniform and stable (owing to addition of gallium (Ga)), and has improved electric characteristics owing to addition of indium (In). In addition, a semiconductor layer formed of amorphous IGZO has high mobility and good chemical resistance. Alternatively, the semiconductor layer 140 may be an amorphous silicon based substrate, a polycrystalline silicon based substrate, or an organic thin film substrate. However, the present invention is not limited to such materials.

The electrode layer 150 is formed on the gate insulation film 130 in a manner such that a top surface of the semiconductor layer 140 can be partially exposed through the electrode layer 150. That is, a portion of the top surface, which is facing away from the gate insulation film, is covered by the electrode layer 150. The electrode layer 150 may have a thickness of about 500 nm. The electrode layer 150 has a double layer structure including a seed layer 150a and a main layer 150b.

In detail, the seed layer 150a makes contact with the gate insulation film 130 and lateral sides of the semiconductor layer 140. The seed layer 150a further partially covers the top surface of the semiconductor layer 140. The seed layer 150a is formed of a transparent conductive material doped with IGZO. IGZO reduces the resistivity of the electrode layer 150, and thus the contact resistance between the electrode layer 150 and the semiconductor layer 140 can be reduced. The transparent conductive material may be one selected from indium tin oxide (ITO), indium zinc oxide (IZO), zinc oxide (ZnO), tin oxide ($SnO_2$), and indium oxide ($In_2O_3$). The thickness of the seed layer 150a may be about ¼ the total thickness of the electrode layer 150. For example, the thickness of the seed layer 150a may be about 125 nm (500 nm×¼). If the thickness of the seed layer 150a is smaller than about ¼ the total thickness of the electrode layer 150, the resistivity of the electrode layer 150 may not be sufficiently reduced. If the thickness of the seed layer 150a is greater than about ¼ the total thickness of the electrode layer 150, the electric characteristics of the electrode layer 150 are deteriorated because the main layer 150b which is a main current passage is reduced in thickness.

The main layer 150b makes contact with the seed layer 150a. Particularly, the main layer 150b makes contact with a top surface of the seed layer 150a. The main layer 150b is formed of a transparent conductive material and has a thickness (for example, 375 nm) greater than that of the seed layer 150a. The main layer 150b is a main current passage of the electrode layer 150. The transparent conductive material may be one selected from indium tin oxide (ITO), indium zinc oxide (IZO), zinc oxide (ZnO), tin oxide ($SnO_2$), and indium oxide ($In_2O_3$). The main layer 150b may be formed of the same transparent conductive material as that used to form the seed layer 150a.

The electrode layer 150 has a double layer structure as described above. The electrode layer 150 may be divided into a source electrode (S) disposed at a side of the semiconductor layer 140 and a drain electrode (D) disposed at the other side of the semiconductor layer 140 and spaced apart from the source electrode (S).

The passivation layer 160 is formed on the gate insulation film 130 to cover portions of the semiconductor layer 140 and the electrode layer 150. The passivation layer 160 prevents permeation of contaminants into the thin film transistor 100 so that malfunction or deterioration of the thin film transistor 100 can be prevented. The passivation layer 160 may be formed of silicon oxide ($SiO_x$).

According to the current embodiment, the thin film transistor 100 includes the electrode layer 150 which has the seed layer 150a formed by a transparent conductive material doped with IGZO and the main layer 150b formed of a transparent conductive material. Therefore, the contact resistance between the electrode layer 150 and the semiconductor layer 140 can be reduced, and thus the electric characteristics of the thin film transistor 100 can be improved.

Next, an explanation will be given on a method of manufacturing the thin film transistor 100 according to an embodiment.

Figure 2:
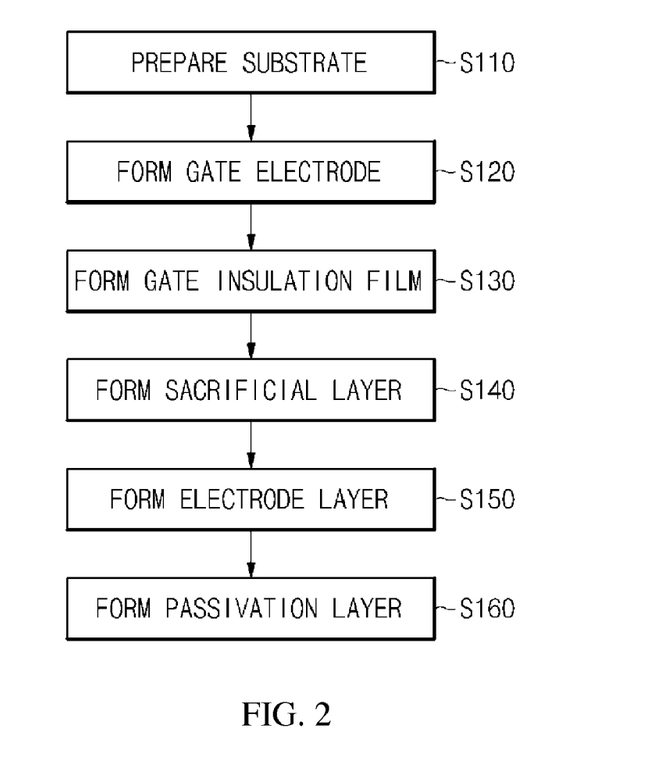
FIG. 2 is a flowchart illustrating a method of manufacturing the thin film transistor of FIG. 1 according to an embodiment.

FIG. 2 is a flowchart illustrating a method of manufacturing the thin film transistor 100 of FIG. 1 according to an embodiment, and FIGS. 3A through 3F are cross sectional views illustrating the thin film transistor manufacturing method of FIG. 2.

Referring to FIG. 2, the thin film transistor manufacturing method includes preparing a substrate (S110), forming a gate electrode (S120), forming a gate insulation film (S130), forming a semiconductor layer (S140), forming an electrode layer (S150), and a forming a passivation layer (S160).

Figure 3A:
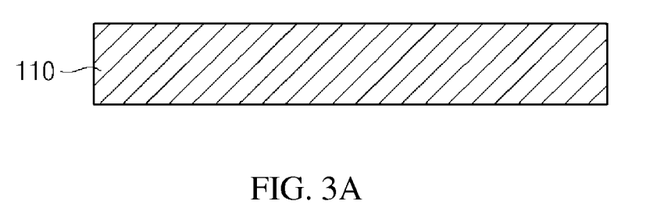
FIGS. 3A through 3F are cross sectional views for explaining the thin film transistor manufacturing method of FIG. 2.

Referring to FIG. 3A, a substrate 110 is prepared in operation 5110. Since the substrate 110 has been described in detail, a detailed description of the substrate 110 will not be repeated.

Figure 3B:
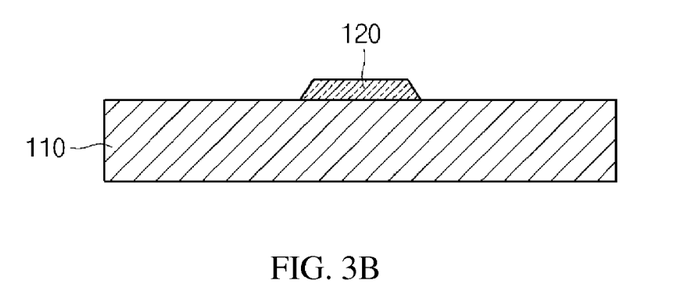

Referring to FIG. 3B, a gate electrode 120 is formed on the substrate 110 in operation 5120. In detail, the gate electrode 120 may be formed by depositing a gate electrode material on the substrate 110 by a method such as an e-beam deposition method. For example, the gate electrode 120 may be formed of chromium (Cr) to a thickness of about 150 nm.

Figure 3C:
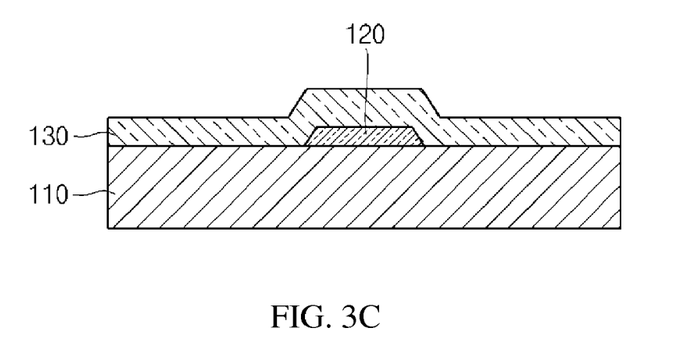

Referring to FIG. 3C, in operation 5130, a gate insulation film 130 is formed on the substrate 110 to cover the gate electrode 120. In detail, the gate insulation film 130 may be formed by depositing a gate insulation film material on the gate electrode 120 by a method such as an inductively coupled plasma chemical vapor deposition (ICP-CVD) method. For example, the gate insulation film 130 may be formed of a silicon oxide ($SiO_2$) to a thickness of about 300 nm.

Figure 3D:
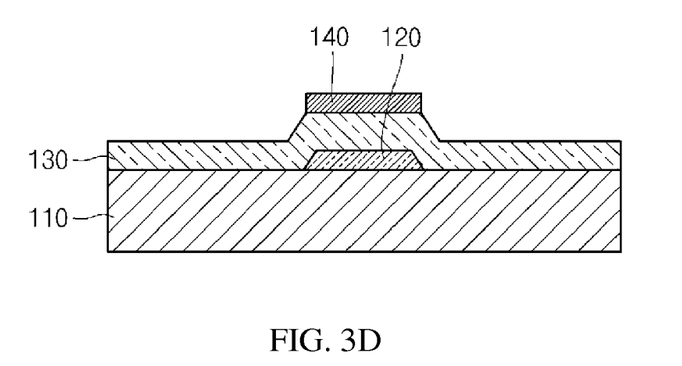

Referring to FIG. 3D, in operation 5140, a semiconductor layer 140 is formed on the gate insulation film 130 in a region corresponding to the gate electrode 120. For example, the semiconductor layer 140 may be formed by depositing amorphous IGZO on the gate insulation film 130 by a radio frequency (RF) sputtering method under an Ar and $O_2$ atmosphere at a pressure lower than $10^{-6}$ Torr. The semiconductor layer 140 may be formed to a thickness of about 45 nm.

Figure 3E:
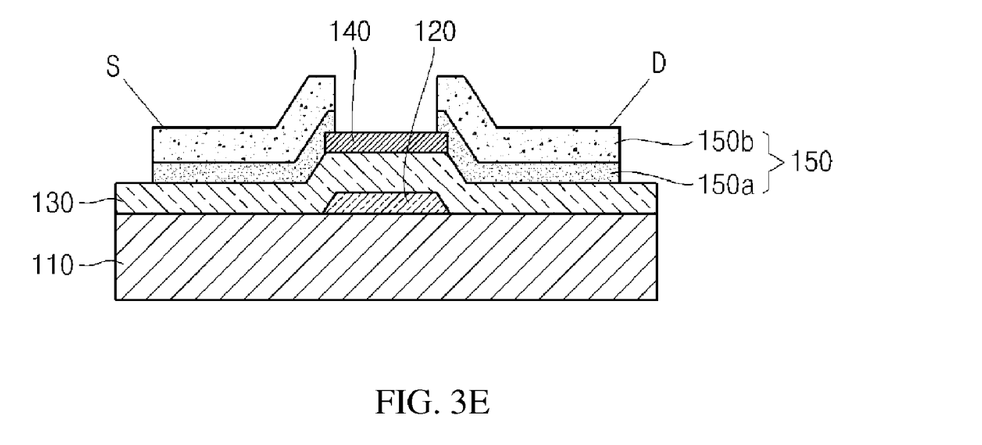

Referring to FIG. 3E, in operation S150, an electrode layer 150 having a double layer structure is formed on the gate insulation film 130 in a manner such that the top surface of the semiconductor layer 140 is partially exposed through the electrode layer 150. In detail, operation S150 includes: forming a seed layer 150a on the topside of the gate insulation film 130 and lateral sides of the semiconductor layer 140; and forming a main layer 150b on the seed layer 150a. The electrode layer 150 including the seed layer 150a and the main layer 150b may be formed by depositing a transparent conductive material doped with IGZO on the gate insulation film 130, depositing a transparent conductive material, and performing a thermal annealing process at about 350° C. for about an hour. The seed layer 150a may have a thickness of about 125 nm, and the main layer 150b may have a thickness of about 375 nm.

Figure 3F:
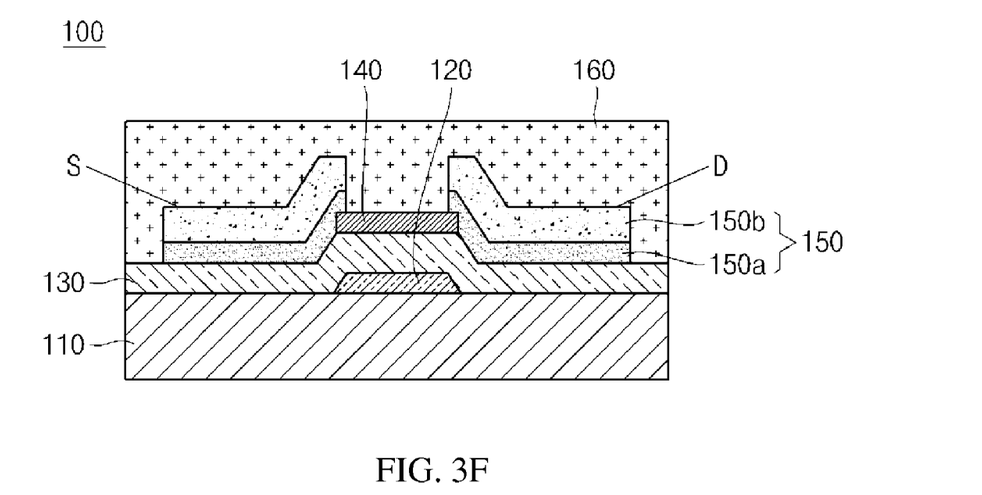

Referring to FIG. 3F, in operation 5160, a passivation layer 160 is formed on the gate insulation film 130 to cover the semiconductor layer 140 and the electrode layer 150. For example, the passivation layer 160 may be formed by depositing silicon oxide ($SiO_x$) on the gate insulation film 130 by an inductively coupled plasma chemical vapor deposition (ICP-CVD) method.

Next, the electric characteristics of a thin film transistor of an embodiment will be compared with the electric characteristics of thin film transistors of comparative examples 1 and 2.

Substrates, gate electrodes, gate insulation films, electrode layers, semiconductor layers, and passivation layers of the thin film transistors of the embodiment and the comparative examples 1 and 2 were formed based on the operations explained with reference to FIGS. 3A through 3F.

That is, quartz-glass substrates were prepared, and gate electrodes were formed of chromium (Cr) on the quartz-glass substrates to a thickness of about 150 nm by using an e-beam evaporator. Then, gate insulation films were formed by depositing silicon oxide ($SiO_2$) on the substrates and the gate electrodes to a thickness of about 300 nm by an inductively coupled plasma chemical vapor deposition (ICP-CVD) method. Semiconductor layers were formed on the gate insulation films in regions corresponding to the gate electrodes. In detail, the semiconductor layers were formed of amorphous indium gallium zinc oxide (IGZO) by injecting indium (In) and gallium (Ga) into zinc oxide (ZnO). The semiconductor layers were formed to a width of about 100 μm and a channel length of about 20 μm. Thereafter, electrode layers were formed on the gate insulation films and the semiconductor layers by using a sputtering apparatus in a manner such that predetermined top surfaces of the semiconductor layers could be exposed through the electrode layers.

Only the electrode layers of the embodiment and the comparative examples 1 and 2 were formed in different method. The methods of forming the electrode layers 150 of the embodiment and the comparative examples 1 and 2 are as follows.

Embodiment

In the thin film transistor manufacturing method of the embodiment, as shown in FIGS. 1 through 3E, the electrode layer was formed on the gate insulation film and the semiconductor layer in a double layer structure. The electrode layer was formed by two-step deposition and annealing as follows: ITO doped with IGZO was deposited to a thickness of about 125 nm; ITO was deposited thereon to a thickness of about 375 nm; and annealing was performed. The two-step deposition was performed at normal temperature and a pressure of $10^{-6}$ Torr or lower, and the annealing was performed for about an hour at about 350° C.

Comparative Example 1

In the thin film transistor manufacturing method of the comparative example 1, the electrode layer was formed on the gate insulation film and the semiconductor layer in a single layer structure. The electrode layer was formed by depositing ITO to a thickness of about 500 nm and annealing the deposited ITO. In the comparative example 1, the deposition and annealing were performed in the same conditions as those in the embodiment.

Comparative Example 2

In the thin film transistor manufacturing method of the comparative example 2, the electrode layer was formed on the gate insulation film and the semiconductor layer in a single layer structure. The electrode layer was formed as follows:

ITO doped with IGZO was deposited to a thickness of about 500 nm, and annealing was performed. In the comparative example 2, the deposition and annealing were performed in the same conditions as those in the embodiment.

Hereinafter, explanations will be given on the resistivities, hall mobilities, and carrier concentrations of electrode layers of thin film transistors fabricated according to the embodiment and the comparative examples 1 and 2.

Figure 4A:
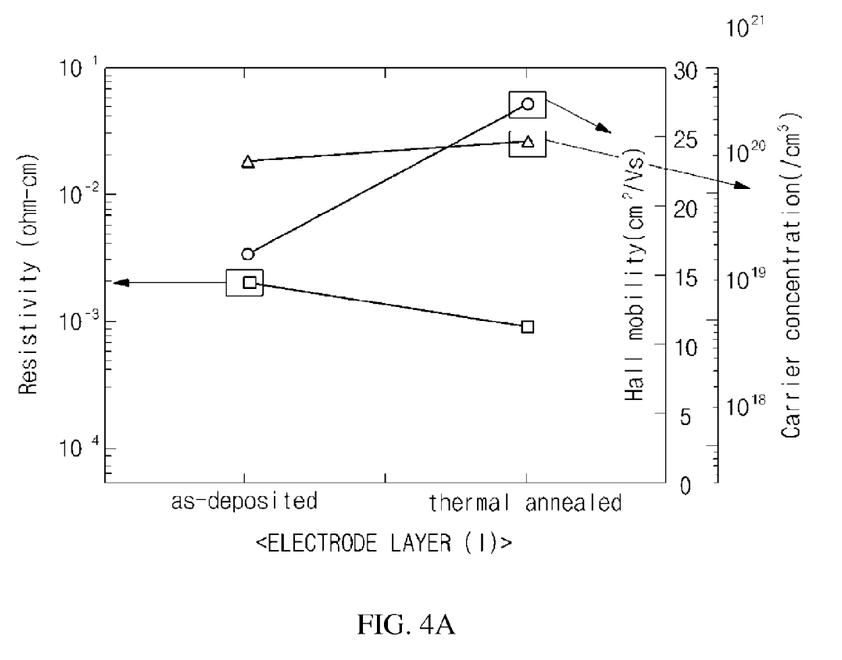
FIGS. 4A through 4C are test result graphs showing the resistivities, hall mobilities, and carrier concentrations of electrode layers of thin film transistors of an embodiment and comparative examples 1 and 2.
Figure 4B:
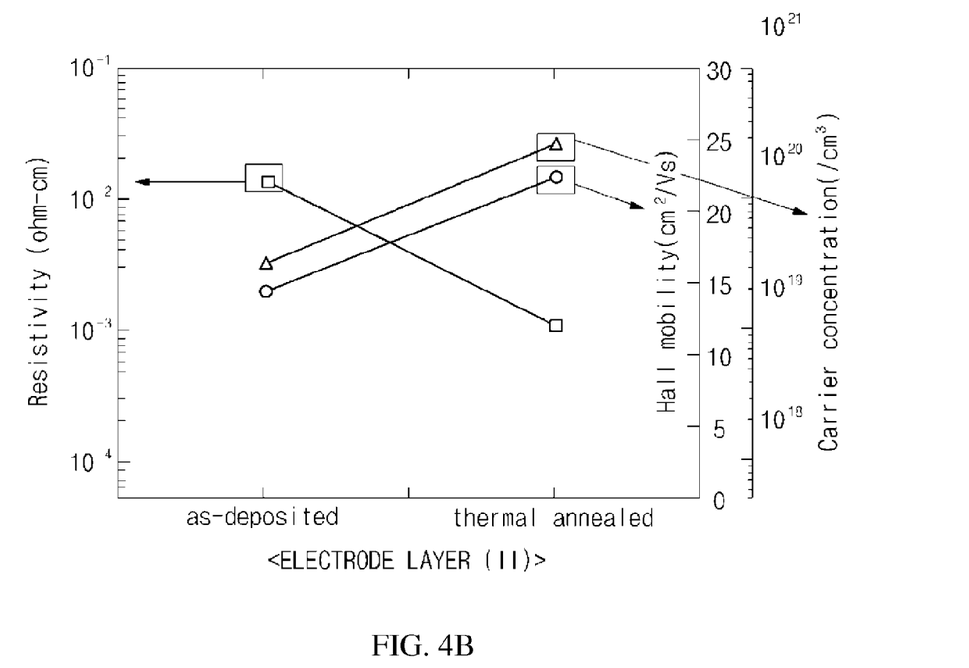
Figure 4C:
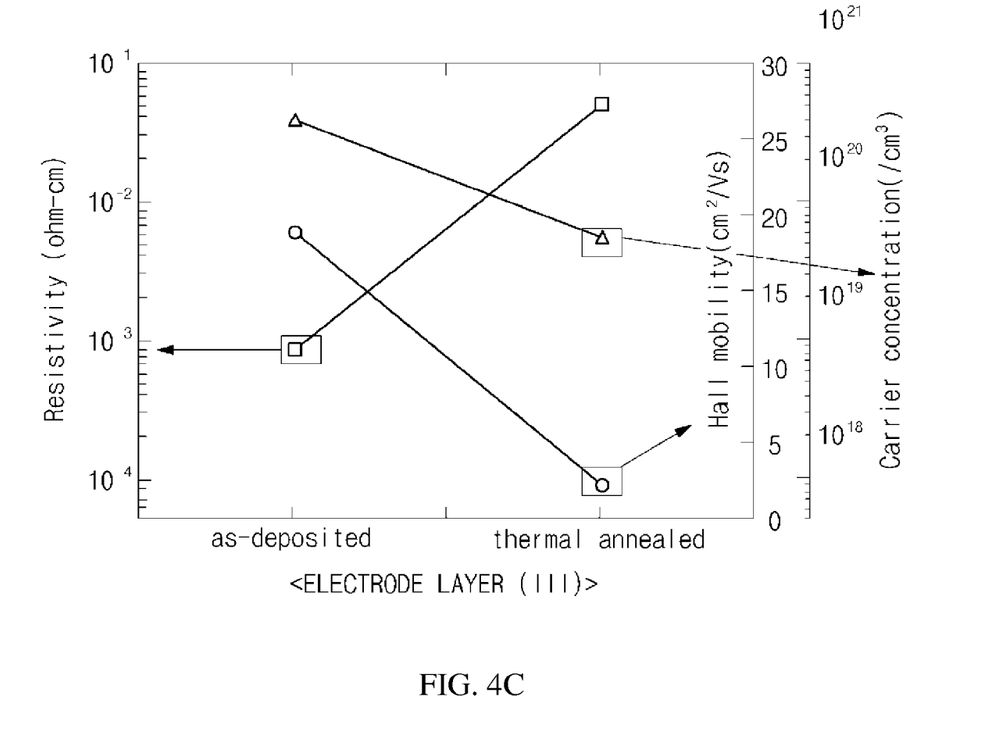

FIGS. 4A through 4C are test result graphs showing the resistivities, hall mobilities, and carrier concentrations of electrode layers of thin film transistors fabricated according to the embodiment and the comparative examples 1 and 2. The resistivities, hall mobilities, and carrier concentrations of the electrode layers were measured under the conditions of DC power 300 W and 2 mTorr.

In detail, FIG. 4A shows the resistivity, hall mobility, and carrier concentration of a electrode layer (I) of a thin film transistor fabricated according to the embodiment (ITO doped with IGZO was deposited on a substrate to a thickness of about 125 nm, and then ITO was deposited to a thickness of about 375 nm to form the electrode layer (I) in a double layer structure). FIG. 4B shows the resistivity, hall mobility, and carrier concentration of a electrode layer (II) of a thin film transistor fabricated according to the comparative example 1 (ITO was deposited on a substrate to a thickness of about 500 nm to form the electrode layer (II) in a single layer structure). FIG. 4C shows the resistivity, hall mobility, and carrier concentration of an electrode layer (III) of a thin film transistor fabricated according to the comparative example 2 (ITO doped with IGZO was deposited on a substrate to a thickness of about 500 nm to form the electrode layer (III) in a single layer structure). The test results are arranged in Table 1.

TABLE 1

| | | Resistivity [Ω·cm] | Hall mobility [cm²/Vs] | Carrier Concentration [/cm³] |
|---|---|---|---|---|
| Electrode layer (I) | as deposited | 0.002 | 16.7 | 1.77E+20 |
| | as thermal annealed | 0.0009 | 27.5 | 2.50E+20 |
| Electrode layer (II) | as deposited | 0.0142 | 14.4 | 3.06E+19 |
| | as thermal annealed | 0.00111 | 22.6 | 2.49E+20 |
| Electrode layer (III) | as deposited | 0.000851 | 18.9 | 3.88E+20 |
| | as thermal annealed | 0.0521 | 2.27 | 5.29E+19 |

Referring to Table 1, the resistivity of the electrode layer (I) was reduced from $2\times10^{-3}$ Ω·cm to $9\times10^{-4}$ Ω·cm. The resistivity of the electrode layer (II) was reduced from $1.42\times10^{-2}$ Ω·cm to $1.11\times10^{-3}$ Ω·cm. The resistivity of the electrode layer (III) was largely increased from $8.51\times10^{-4}$ Ω·cm to $5.21\times10^{-2}$ Ω·cm. That is, the resistivities of the electrode layers (I) and (II) were reduced. After thermal annealing, the resistivity of the electrode layer (I) was lower than that of the electrode layer (II) of the comparative example 1.

The hall mobility of the electrode layer (I) was increased from 16.7 cm²/Vs to 27.5 cm²/Vs. The hall mobility of the electrode layer (II) was increased from 14.4 cm²/Vs to 22.6 cm²/Vs. The hall mobility of the electrode layer (III) was reduced from 18.9 cm²/Vs to 2.27 cm²/Vs. That is, the hall mobilities of the electrode layers (I) and (II) were improved. After the thermal annealing, the hall mobility of the electrode layer (I) was greater than that of the electrode layer (II).

The carrier concentration of the electrode layer (I) was increased from 1.77E+20/cm³ to 2.50E+20/cm³. In the electrode layer (II) of the thin film transistor of the comparative example 1, the carrier concentration was increased from 3.06E+19/cm³ to 2.49E+20/cm³. In the electrode layer (III) of the thin film transistor of the comparative example 2, the carrier concentration was reduced from 3.88E+20/cm³ to 5.29E+19/cm³. That is, the carrier concentrations of the electrode layers (I) and (II) were improved. After the thermal annealing, the crystal orientation of the electrode layer (I) was greater than that of the electrode layer (II).

Referring to the test results, the resistivity, hall mobility, and crystal orientation of the electrode layer (I) was improved as compared with those of the electrode layers (II) and (III). That is, the electrode layer (I) may improve the electric characteristics of a thin film transistor.

Next, transfer and output characteristics of the thin film transistor of the embodiment will be compared with those of the thin film transistors of the comparative examples 1 and 2. The transfer and output characteristics of the thin film transistors were simulated under the conditions of $V_{DC}$=10 V and $V_{GS}$=8 V.

Figure 5A:
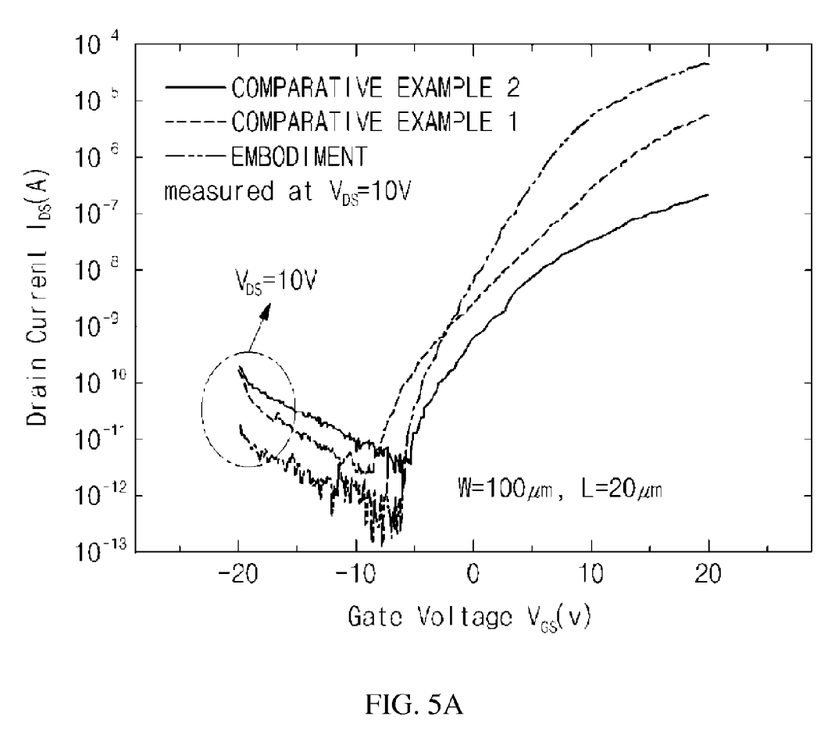
FIGS. 5A and 5B are test result graphs showing the transfer and output characteristics of the thin film transistors of the embodiment and the comparative examples 1 and 2.
Figure 5B:
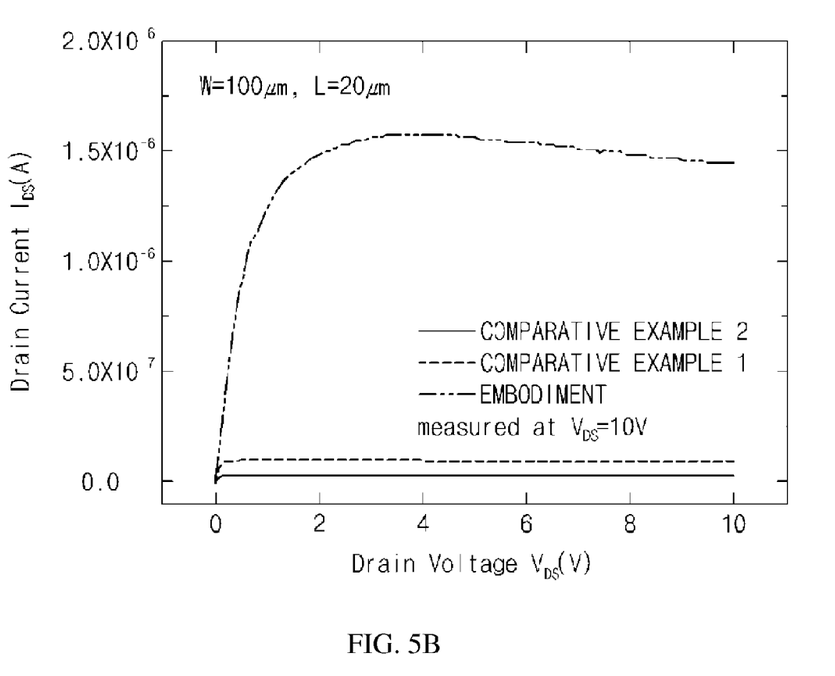

FIGS. 5A and 5B are test result graphs showing the transfer and output characteristics of the thin film transistors of the embodiment and the comparative examples 1 and 2.

In detail, FIG. 5A shows drain currents $I_{DS}$ of the thin film transistors of the embodiment and the comparative example 1 and 2 with respect to gate voltage $V_{GS}$, and FIG. 5B shows drain currents $I_{DS}$ of the thin film transistors of the embodiment and the comparative example 1 and 2 with respect to drain voltage $V_{DS}$. In the graphs of FIGS. 5A and 5B, W and L denote the width and channel length of a semiconductor layer, respectively.

If the values of the graphs of FIGS. 5A and 5B are input to Equations 1 and 2, the saturation mobility of the thin film transistor of the embodiment is 9.74 cm²/Vs, the saturation mobility of the thin film transistor of the comparative example 1 is 2.339 cm²/Vs, and the saturation mobility of the thin film transistor of the comparative example 2 is 0.078 cm²/Vs. That is, the saturation mobility of the thin film transistor of the embodiment is highest.

$$I_D(sat) = \frac{\mu_n C_{ox}}{2}\left(\frac{W}{L}\right)(V_{GS} - V_T)^2 = \text{constant} \quad \text{[Equation 1]}$$

$$\mu_{sat} = \frac{2L}{CW}\left(\frac{\Delta\sqrt{I_{DS}}}{\Delta V_G}\right)^2 \quad \text{[Equation 2]}$$

Referring to the test results, the saturation mobility of the thin film transistor of the embodiment is more satisfactory than those of the thin film transistors of the comparative examples 1 and 2. That is, according to the embodiment, electric characteristics of the thin film transistor are improved.

Next, an explanation will be given on voltage-current characteristics of the electrode layers of the thin film transistors of the embodiment and the comparative examples 1 and 2.

Figure 6A:
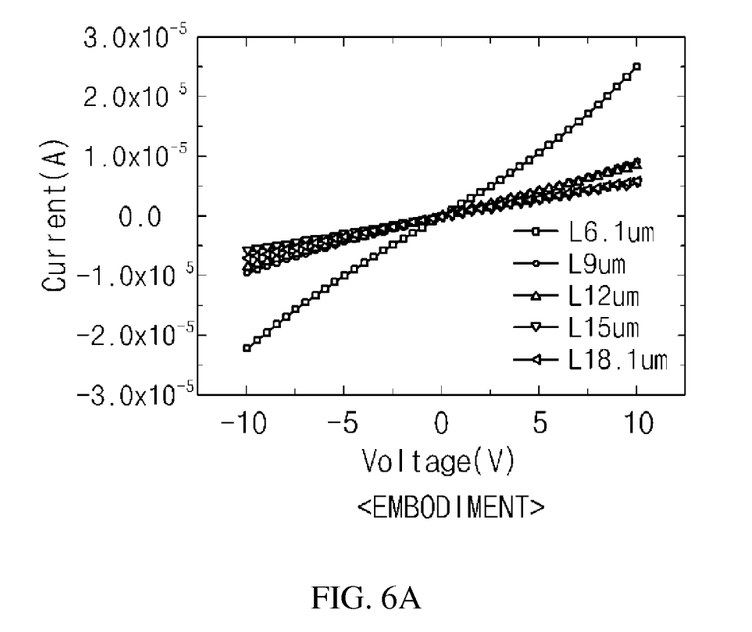
FIGS. 6A through 6C are test result graphs showing current-voltage characteristics of the electrode layers of the thin film transistors of the embodiment and the comparative examples 1 and 2.
Figure 6B:
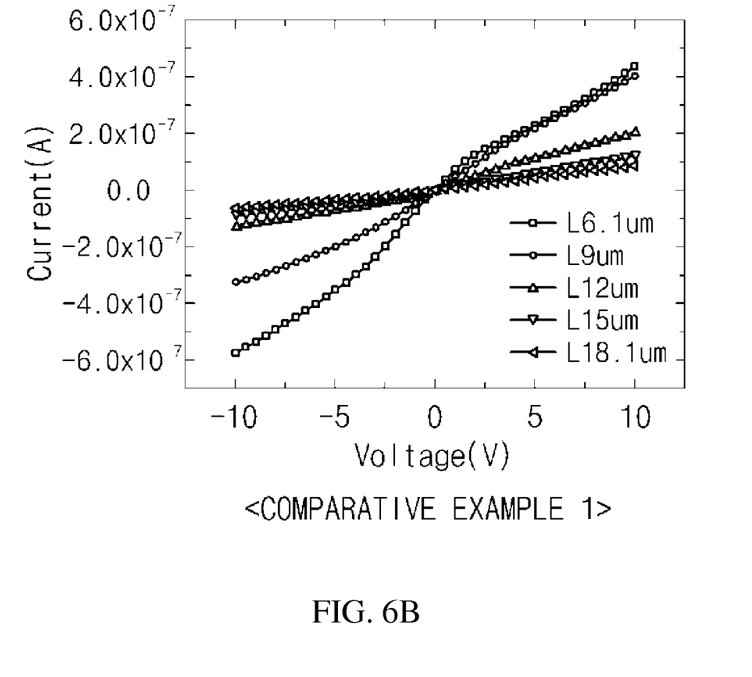
Figure 6C:
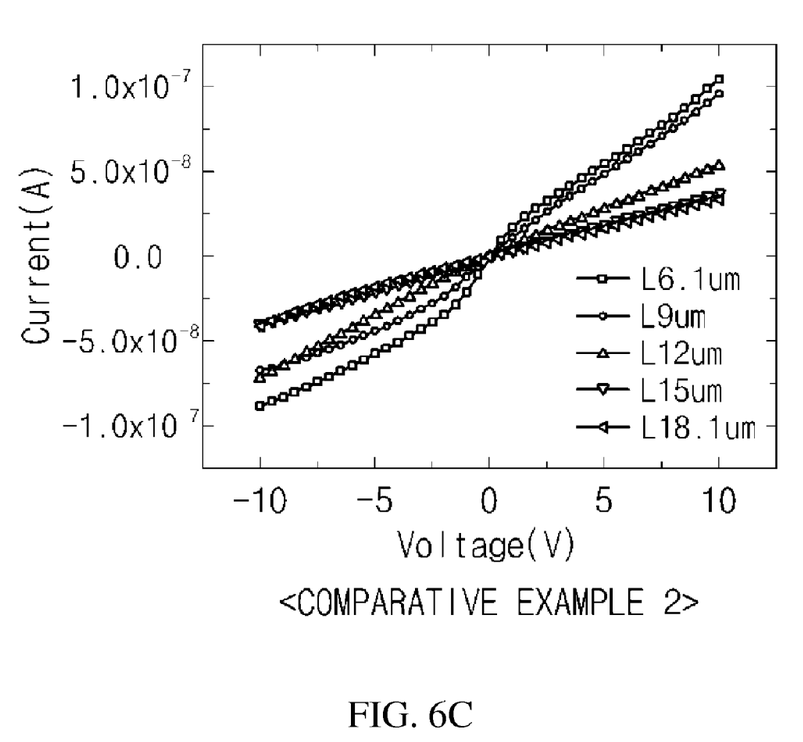

FIGS. 6A through 6C are test result graphs showing current-voltage characteristics of the electrode layers of the thin film transistors of the embodiment and the comparative examples 1 and 2. In the graphs of FIGS. 6A through 6C, L denotes channel lengths of semiconductor layers.

In detail, FIG. 6A shows the current-voltage characteristics of the electrode layer of the thin film transistor of the embodiment for different semiconductor layer lengths. FIG. 6B shows the current-voltage characteristics of the electrode layer of the thin film transistor of the comparative example 1 for different semiconductor layer lengths. FIG. 6C shows the current-voltage characteristics of the electrode layer of the thin film transistor of the comparative example 2 for different semiconductor layer lengths.

Referring to FIG. 6A, in the thin film transistor of the embodiment, if the channel length of the semiconductor layer is 6.1 μm and 10 V is applied to the electrode layer, the current value is about $2.5 \times 10^{-5}$ A. Referring to FIG. 6B, in the thin film transistor of the comparative example 1, if the channel length of the semiconductor layer is 6.1 μm and 10 V is applied to the electrode layer, the current value is about $4.5 \times 10^{-7}$ A. Referring to FIG. 6C, in the thin film transistor of the comparative example 2, if the channel length of the semiconductor layer is 6.1 μm and 10 V is applied to the electrode layer, the current value is about $1.0 \times 10^{7}$ A. That is, when the same voltage is applied, the current value of the electrode layer of the thin film transistor of the embodiment is highest. This means the electric characteristics of the thin film transistor of the embodiment are improved.

Hereinafter, the sheet resistance $\rho_s$, specific contact resistance $\rho_c$, and total contact resistance $R_c$ of the thin film transistors of the embodiment and the comparative examples 1 and 2 will be compared. The sheet resistance $\rho_s$ denotes the resistance of a surface of an electrode layer, the specific contact resistance $\rho_c$ denotes the resistance of an interface between an electrode layer and a semiconductor layer, and the total contact resistance $R_c$ denotes the resistance of an inner region between an electrode layer and a semiconductor layer.

Table 2 shows test results of the sheet resistance $\rho_s$, specific contact resistance $\rho_c$, and total contact resistance $R_c$ of the thin film transistors of the embodiment and the comparative examples 1 and 2.

TABLE 2

| | Sheet resistance ($\rho_S$) | Specific contact resistance ($\rho_c$) | Total contact resistance ($R_c$) |
|---|---|---|---|
| Embodiment | 1.06E+07 [Ω] | 8.41E−07 [Ω] | −2.99E+04 [Ω] |
| Comparative example 1 | 8.91E+08 [Ω] | 7.86E−03 [Ω] | −2.65E+07 [Ω] |
| Comparative example 2 | 2.23E+09 [Ω] | 1.06E−02 [Ω] | −4.86E+07 [Ω] |

Referring to Table 2, the sheet resistance $\rho_s$, specific contact resistance $\rho_c$, and total contact resistance $R_c$ of the thin film transistor of the embodiment are lower than those of the thin film transistors of the comparative examples 1 and 2. Referring to the test results, the sheet resistance $\rho_s$, specific contact resistance $\rho_c$, and total contact resistance $R_c$ of the thin film transistor of the embodiment are improved as compared with those of the thin film transistors of the comparative examples 1 and 2. That is, according to the embodiment, electric characteristics of the thin film transistor are improved.

According to the thin film transistor and the method of manufacturing the thin film transistor of the embodiments, the seed layer of the electrode layer is formed of a transparent conductive material doped with IGZO, and the main layer of the electrode layer is formed of a transparent conductive material. Therefore, the contact resistance between the electrode layer and the semiconductor layer can be reduced, and thus the electric characteristics of the thin film transistor can be improved.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A thin film transistor comprising:
   a substrate;
   a gate electrode disposed on the substrate;
   a gate insulation film disposed on the substrate to cover the gate electrode;
   a semiconductor layer disposed on the gate insulation film in a region corresponding to the gate electrode;
   an electrode layer having a double layer structure and disposed on the gate insulation film in a manner such that a topside portion of the semiconductor layer is exposed through the electrode layer; and
   a passivation layer disposed on the gate insulation film to cover the semiconductor layer and the electrode layer,
   wherein the electrode layer comprises:
      a seed layer making contact with a top surface of the gate insulation film and a lateral surface of the semiconductor layer; and
      a main layer making contact with a top surface of the seed layer,
      wherein the seed layer is formed by doping a transparent conductive material with indium gallium zinc oxide (IGZO).

2. The thin film transistor of claim 1 wherein the main layer is thicker than the seed layer.

3. The thin film transistor of claim 1 wherein a thickness of the seed layer is about ¼ of a total thickness of the electrode layer.

4. The thin film transistor of claim 1 wherein the main layer is formed of a transparent conductive material.

5. The thin film transistor of claim 1 wherein the transparent conductive material is selected from the group consisting of indium tin oxide (ITO), indium zinc oxide (IZO), zinc oxide (ZnO), tin oxide ($SnO_2$), and indium oxide ($In_2O_3$).

6. The thin film transistor of claim 4 wherein the transparent conductive material is selected from the group consisting of indium tin oxide (ITO), indium zinc oxide (IZO), zinc oxide (ZnO), tin oxide ($SnO_2$), and indium oxide ($In_2O_3$).

7. The thin film transistor of claim 1 wherein the electrode layer is divided into a source electrode disposed at a side of the semiconductor layer, and a drain electrode disposed at the other side of the semiconductor layer and spaced apart from the source electrode.

8. A thin film transistor comprising:
   a substrate;
   a gate electrode disposed on the substrate;
   a gate insulation film disposed on the substrate to cover the gate electrode;
   a semiconductor layer disposed on the gate insulation film in a region corresponding to the gate electrode;
   an electrode layer having a double layer structure and disposed on the gate insulation film in a manner such that a topside portion of the semiconductor layer is exposed through the electrode layer, wherein the double layer comprises a seed layer having a thickness of about 125 nm and a main layer having a thickness of about 375 nm and coupled to a top surface of the seed layer; and
   a passivation layer disposed on the gate insulation film to cover the semiconductor layer and the electrode layer,
   wherein the seed layer is formed by doping a transparent conductive material with indium gallium zinc oxide (IGZO).

9. The thin film transistor of claim 8 wherein the seed layer coupled to a top surface of the gate insulation film, a side surface of the semiconductor layer, and a portion of a top surface of the semiconductor layer.

10. The thin film transistor of claim 8 wherein the main layer is formed of a transparent conductive material.

11. The thin film transistor of claim 8 wherein the transparent conductive material is selected from the group consisting of indium tin oxide (ITO), indium zinc oxide (IZO), zinc oxide (ZnO), tin oxide ($SnO_2$), and indium oxide ($In_2O_3$).

12. The thin film transistor of claim 10 wherein the transparent conductive material is selected from the group consisting of indium tin oxide (ITO), indium zinc oxide (IZO), zinc oxide (ZnO), tin oxide ($SnO_2$), and indium oxide ($In_2O_3$).

13. The thin film transistor of claim 8 wherein the electrode layer is divided into a source electrode disposed at a side of the semiconductor layer, and a drain electrode disposed at the other side of the semiconductor layer and spaced apart from the source electrode.

* * * * *